(12) United States Patent
Coutelou et al.

(10) Patent No.: US 10,288,650 B2
(45) Date of Patent: May 14, 2019

(54) ELECTRIC POWER CALCULATION SYSTEM, ELECTRIC CABINET COMPRISING ONE SUCH SYSTEM, ASSOCIATED TRANSFORMER SUBSTATION AND CALCULATION METHOD

(71) Applicant: Schneider Electric Industries SAS, Rueil-Malmaison (FR)

(72) Inventors: Olivier Coutelou, Grenoble (FR); Christophe Mollier, Villeurbanne (FR); Maxime Gaillard, Gieres (FR); Damien Sillans, Lans En Vercors (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 895 days.

(21) Appl. No.: 14/541,347

(22) Filed: Nov. 14, 2014

(65) Prior Publication Data
US 2015/0142354 A1   May 21, 2015

(30) Foreign Application Priority Data

Nov. 15, 2013   (FR) .................................... 13 61222

(51) Int. Cl.
*G01D 4/00* (2006.01)
*G01R 19/00* (2006.01)

(52) U.S. Cl.
CPC ......... *G01R 19/0084* (2013.01); *G01D 4/002* (2013.01); *Y02B 90/241* (2013.01); *Y04S 20/32* (2013.01)

(58) Field of Classification Search
None
See application file for complete search history.

(56) References Cited

U.S. PATENT DOCUMENTS 5,325,048 A * 6/1994 Longini ................. G01R 35/04
                                                    324/130
5,517,106 A * 5/1996 Longini ............... G01R 21/133
                                                    324/103 R (Continued)

FOREIGN PATENT DOCUMENTS

WO    WO 2013/017663 A1    2/2013

OTHER PUBLICATIONS

French Preliminary Search Report dated Jul. 17, 2014 in French Application 13 61222, filed on Nov. 15, 2013 ( with English Translation of categories of Cited Documents and Written Opinion).

*Primary Examiner* — Fernando L Toledo
*Assistant Examiner* — Adam S Bowen
(74) *Attorney, Agent, or Firm* — Oblon, McClelland, Maier & Neustadt L L P

(57) ABSTRACT

This system comprises a first device comprising a member for measuring voltage of a primary conductor, means for sampling the measured voltage, means for transmitting a first message, and means for determining a set of variable values representative of the voltage, based on the voltage measured during a given transmission period; at least one second device having a current sensor for determining intensity in a secondary conductor connected to the primary conductor, means for sampling the measured intensity; and a member for calculating said energy, including means for receiving the first message and being configured for calculating an energy during the given transmission period on the basis of said data set and intensity samples associated with the given transmission period.
The determination means are configured for determining said data set based on a correction coefficient which depends on a value representative of the voltage only for each voltage period where said value is greater than a threshold.

10 Claims, 6 Drawing Sheets

(56) References Cited

U.S. PATENT DOCUMENTS

| | | | |
|---|---|---|---|
| 5,805,395 A * | 9/1998 | Hu | H02H 7/04 |
| | | | 361/21 |
| 8,014,964 B1 | 9/2011 | Khalsa | |
| 8,768,341 B2 | 7/2014 | Coutelou et al. | |
| 2010/0283434 A1* | 11/2010 | Kakiuchi | H02J 7/0016 |
| | | | 320/166 |
| 2013/0211751 A1* | 8/2013 | Park | G01R 21/06 |
| | | | 702/61 |
| 2014/0239941 A1 | 4/2014 | Coutelou et al. | |
| 2014/0368351 A1 | 6/2014 | Coutelou et al. | |
| 2014/0208130 A1* | 7/2014 | Morales | G06F 1/30 |
| | | | 713/300 |

* cited by examiner

ELECTRIC POWER CALCULATION SYSTEM, ELECTRIC CABINET COMPRISING ONE SUCH SYSTEM, ASSOCIATED TRANSFORMER SUBSTATION AND CALCULATION METHOD

BACKGROUND OF THE INVENTION

The present invention relates to a computation system for calculating the electrical energy of an alternating current flowing in at least one secondary electrical conductor being electrically connected to a primary electrical conductor, the primary conductor and each secondary conductor having substantially the same alternating voltage, the alternating current having at least one phase.

This calculation system includes:
- a first device comprising a radio transmitter, a measuring member for measuring the voltage of the primary conductor, first sampling means for sampling the value of the measured voltage, message transmitting means for transmitting, following a period of transmission, of a first message, the transmission period corresponding to a multiple of voltage periods, the voltage period being equal to the inverse of the frequency of the alternating voltage, and voltage determination means for determining a set of at least one variable value representative of the measured voltage, said data set being determined based on the value of the voltage measured during a given transmission period, with the first message containing said data set;
- at least one second device comprising a current intensity sensor for determining the intensity of the current flowing in the corresponding secondary conductor, second sampling means for sampling the value of the measured intensity; and
- at least one computing member for calculating the electrical energy for each phase of said current flowing in the corresponding secondary conductor, the computing member being connected to at least one corresponding second device and including a radio receiver and message reception means for receiving the first message, each computing member being configured for calculating a value for the electrical energy during the given transmission period on the basis of said data set contained in the first message and samples of the intensity associated with the given transmission period.

The present invention also relates to an electrical cabinet including a panel comprising output electrical conductors, and such a computation system.

The present invention also relates to a transformer substation for transformation of an electric current having a first alternating voltage into an electric current having a second alternating voltage, this transformer substation including such an electrical cabinet, an input panel including at least one input electrical conductor configured for being connected to an electrical network, the input electrical conductor having the first alternating voltage, the panel of the electrical cabinet forming an output panel wherein the corresponding output conductors have the second alternating voltage. The transformer substation further includes an electrical transformer connected between the input panel and the output panel, the transformer being configured for transforming the current having the first alternating voltage into the current having the second alternating voltage.

This present invention also relates to a method for calculating the electrical energy by using such a computation system.

A computation system of the aforementioned type is already known from the document WO A1 2013/017663. The computation system includes a first device, referred to as primary module, comprising a radio transmitter, a measuring member for measuring the voltage of the primary conductor, the sampling means for sampling the value of the measured voltage, and the message transmitting means for transmitting of a first message. The period of transmission of the first message is equal to one second, and corresponds to 50 voltage periods, with the voltage period being equal to the inverse of the frequency of the alternating voltage, which is 20 ms. The computation system also includes a plurality of second devices, referred to as secondary modules, each comprising a current intensity sensor for determining the intensity of the current flowing in the corresponding secondary conductor, the sampling means for sampling the value of the measured intensity, and a computing member for calculating the electrical energy for each phase of said current flowing in the corresponding secondary conductor.

In order to calculate the electrical energy, the computing member calculates, at each voltage period, that is to say at time intervals of 20 ms, an active power based on the values of the measured intensities and the voltage values received in the first message. The active energy is calculated by incrementing for each phase, a positive energy counter when the calculated active power is positive, and incrementing a negative energy counter when the calculated active power is negative. The electrical energy is calculated for the given transmission period and on the basis of a set of variable values representative of the measured voltage. This data set is determined for a voltage period selected from among the plurality of voltage periods occurring during the given transmission period, in order to limit the amount of data transmitted by radio waves between the elements of the system for calculation of the electrical energy.

However, the calculation of the electrical energy by means of such a computation system is not optimal.

SUMMARY OF THE INVENTION

The object of the invention relates to providing a more accurate computation system.

To this end, the object of the invention relates to a computation system of the aforementioned type, wherein the measured voltage determination means are configured for determining said data set based further on a correction coefficient associated with the given transmission period, the correction coefficient being, for each phase, a function of a value representative of the voltage only for each corresponding voltage period where said representative value is greater than a predetermined threshold value, the value representative of the voltage preferably being the value of the modulus of the fundamental of a Fourier series decomposition of the voltage.

With the computation system according to the invention, the electrical energy is calculated in a more accurate manner, the correction coefficient is used to take into account, for the calculation of the energy, the value representative of the voltage over the course of several periods of voltage, starting from the time instant where said representative value is greater than the predetermined threshold value. The quantity of data transmitted by radio waves is in addition identical to that transmitted with the computation system belonging to the state of the art.

With the computation system known in the state of the art, the energy is calculated via said value representative of the voltage for the sole voltage period selected from among the plurality of voltage periods occurring during the given transmission period, and the calculation of energy is therefore less precise than with the computation system according to the invention.

According to other advantageous aspects of the invention, the computation system includes one or more of the following characteristic feature(s), taken into consideration in isolation or in accordance with any technically possible combinations:

the correction coefficient satisfies, for each phase, the following equation:

$$\sigma_i = \frac{1}{k_{max}} \times \sum_{\forall k / \|U_{i,1,k}\| \geq \varepsilon} \frac{\|U_{i,1,k}\|}{\|U_{i,1,k_0}\|}$$

where i is an index of the corresponding phase, k is an index of the voltage period, with k comprised between 1 and K, K being equal to the number of voltage periods occurring during a transmission period, $k_0$ is the index of a voltage period selected from among the plurality of voltage periods, $k_{max}$ is the number of voltage periods for which the value of the modulus of the fundamental of the Fourier series decomposition of the voltage is greater than the predetermined threshold value E during the given transmission period, and $\|U_{i,1,k}\|$ and $\|U_{i,1,k_0}\|$, respectively represent the modulus of the fundamental of the Fourier series decomposition of the voltage for the phase having index i and the voltage period having index k, and respectively the selected voltage period having index $k_0$;

said set of at least one representative variable value has a plurality of real and imaginary coefficients of a Fourier series decomposition of the measured voltage, the number of rows of the Fourier series decomposition preferably being greater than or equal to 5, more preferably equal to 17;

the electric energy satisfies, for each phase, the following equations:

$$E_i = \sum_{j=1}^{J} E_{i,j} \text{ and } E_{i,j} = \sum_{k=1}^{K} P_{i,j,k} \times P_{transmission}$$

where i is an index of the corresponding phase, j is a row of the Fourier series decomposition, with j between 1 and J, J being equal to the number of rows of said decomposition, the fundamental corresponding to the row that is equal to 1, k is an index of the corresponding voltage period, with k between 1 and K, K being equal to the number of voltage periods occurring during a transmission period, and $P_{i,j,k}$ represents the active power for the phase having index i, the real and imaginary coefficients of row j and the voltage period having index k;

the measured voltage determination means are in addition configured for determining, for each phase, an angular deviation based on a ratio for at least one voltage period, the ratio being equal to the imaginary coefficient of the fundamental of a Fourier series decomposition of the voltage over said voltage period divided by the real coefficient of said fundamental of the voltage, and the computing member is configured for calculating a value for the electrical energy based furthermore on the angular deviation, the angular deviation is determined, for each phase, via the following equations:

$$\alpha_i = \frac{1}{K-1} \sum_{k=1}^{K-1} \alpha_{i,k} \text{ and } \alpha_{i,k} = \varphi_i(k+1) - \varphi_i(k) \forall k \in [1; K-1]$$

$$\text{that is } \alpha_i = \frac{\varphi_i(K) - \varphi_i(1)}{K-1} \text{ with } \varphi_i(k) = \arctan\left(\frac{\text{Im}U_{i,1,k}}{\text{Re}U_{i,1,k}}\right)$$

where i is an index of the corresponding phase, k is an index of the voltage period, with k comprised between 1 and K, K being equal to the number of voltage periods occurring during a transmission period, and $U_{i,1,k}$ represents the fundamental of the voltage for the phase having index i and the voltage period having index k.

the first real and imaginary coefficients of a Fourier series decomposition of the measured voltage are calculated via the following equations, for each voltage period having an index comprised between 3 and K, the selected voltage period having an index equal to 2:

$\text{Re}U_{i,j,k} = \cos(j \times \alpha_i) \times \text{Re}U_{i,j,k-1} - \sin(j \times \alpha_i) \times \text{Im}U_{i,j,k-1}$ $\text{Im}U_{i,j,k} = \cos(j \times \alpha_i) \times \text{Im}U_{i,j,k-1} + \sin(j \times \alpha_i) \times \text{Re}U_{i,j,k-1}$ and the first real and imaginary coefficients of a Fourier series decomposition of the measured voltage are calculated via the following equations, for the voltage period having index equal to 1:

$\text{Re}U_{i,j,1} = \cos(-j \times \alpha_i) \times \text{Re}U_{i,j,2} - \sin(-j \times \alpha_i) \times \text{Im}U_{i,j,2}$ $\text{Im}U_{i,j,1} = \cos(-j \times \alpha_i) \times \text{Im}U_{i,j,2} + \sin(-j \times \alpha_i) \times \text{Re}I_{i,j,2}$.

The object of the invention also relates to an electrical cabinet comprising:

a panel including at least one primary output electrical conductor and at least one secondary output electrical conductor, each secondary output conductor being electrically connected to a corresponding primary output conductor, the current flowing in the corresponding output conductors having an alternating voltage, and a computation system for calculating the electrical energy of the current flowing in each secondary output conductor, wherein the computation system is as defined here above.

The object of the invention also relates to a transformer substation for transformation of an electric current having a first alternating voltage into an electric current having a second alternating voltage, including an electrical cabinet as defined here above, an input panel including at least one input electrical conductor configured for being connected to an electrical network, the input electrical conductor having the first alternating voltage, the panel of the electrical cabinet forming an output panel wherein the corresponding output conductors have the second alternating voltage, and an electrical transformer connected between the input panel and the output panel, the transformer being configured for transforming the current having the first alternating voltage into the current having the second alternating voltage.

The invention also relates to a method for calculating the electric energy of the current flowing in at least one secondary electrical conductor, the secondary conductor being electrically connected to a primary electrical conductor, the primary conductor and each secondary conductor having substantially the same alternating voltage, the alternating current having at least one phase, the method including the following steps:

(a) measuring, by a first device, of the voltage of the current flowing in the primary conductor, the sampling of the value of the measured voltage, determination of a set of at least one variable value representative of the measured voltage, said data set being determined based on the value of the voltage measured during a given transmission period, with the first message containing said data set, and transmitting, following a period of transmission, of a first message, the transmission period corresponding to a multiple of voltage periods, the voltage period being equal to the inverse of the frequency of the alternating voltage, (b) measuring, by a second device, of the intensity of the current flowing in the corresponding secondary conductor, and sampling of the value of the measured intensity, and (c) calculation, by at least one computing member, of the electric energy for each phase of said current flowing in the corresponding secondary conductor, the computing member being connected to at least one corresponding second device and including a radio receiver and the message reception means for receiving the first message, the calculation of the electric energy being performed on the basis of said data set contained in the first message and samples of the intensity associated with the given transmission period, wherein, during the step (a), said data set is determined based further on a correction coefficient associated with the given transmission period, the correction coefficient being, for each phase, a function of a value representative of the voltage only for each corresponding voltage period where said representative value is greater than a predetermined threshold value, the value representative of the voltage preferably being the value of the modulus of the fundamental of a Fourier series decomposition of the voltage.

BRIEF DESCRIPTION OF THE DRAWINGS

These features and advantages of the invention will become apparent from the description that follows, given purely by way of non-limiting example, and with reference being made to the accompanying drawings, in which.

DETAILED DESCRIPTION OF THE PREFERRED EMBODIMENTS

In the following of the description, the term "substantially equal to" defines a relationship of equivalency within a range of plus or minus 5%.

Figure 1:
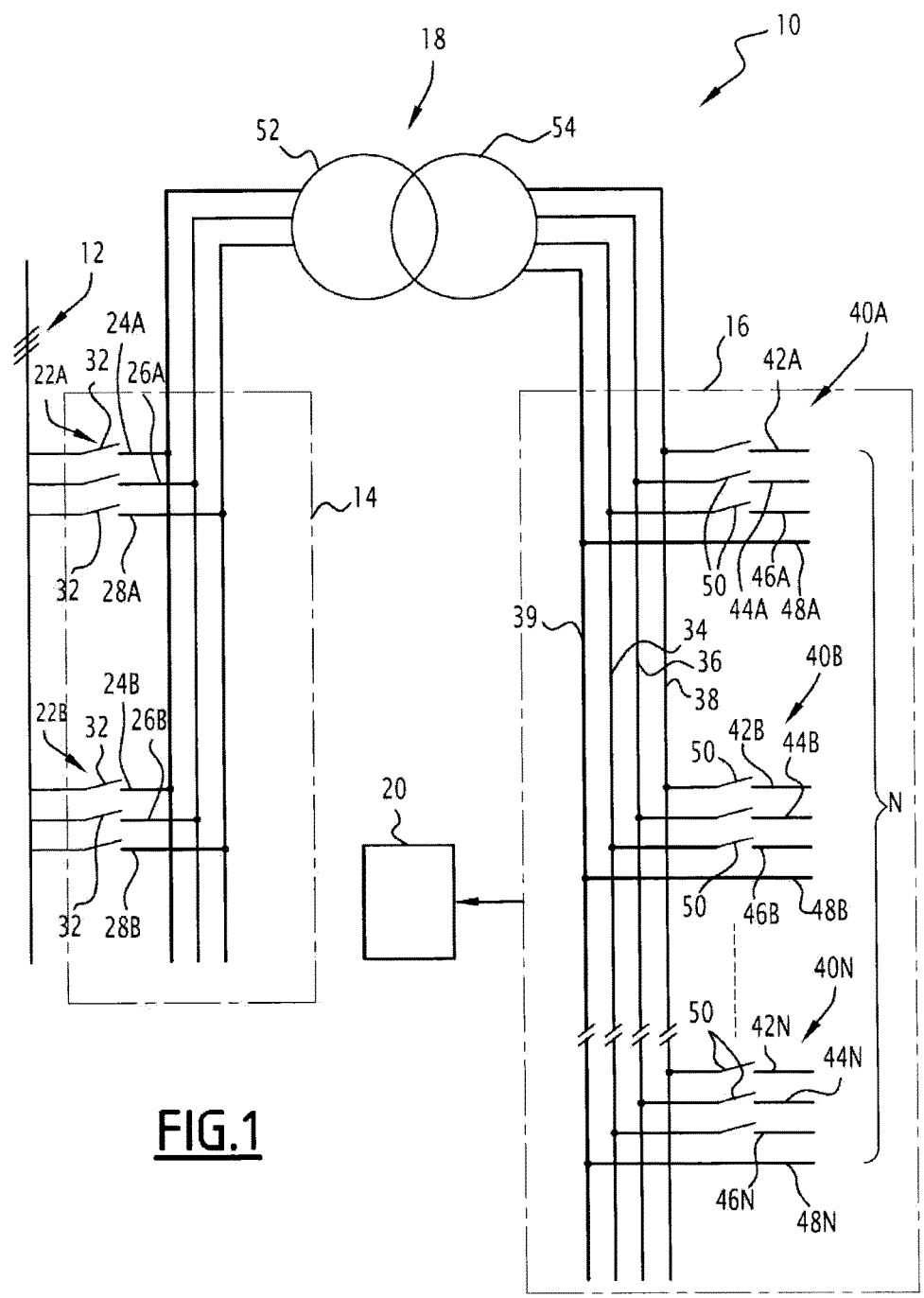
FIG. 1 is a schematic representation of a transformer substation including a first panel, a second panel connected to the first panel by means of a transformer and a computation system for calculating the electric energy of the current flowing in the output conductors of the second panel.

In FIG. 1, a transformer substation 10 connected to an electrical network 12 includes a first panel 14, also known as input panel, a second panel 16, also known as output panel, an electrical transformer 18 connected between the first panel and the second panel 20 and a measuring system for measuring the electrical energy of a current.

Alternatively, an electrical cabinet, not shown, includes the second panel 16 and the measuring system 20. In other words, the electrical cabinet includes the elements of the transformer substation 10 with the exception of the electrical transformer 18 and the first panel 14, the second panel 16 being for example directly supplied with low voltage power.

The transformer substation 10 is configured for transforming the electric current supplied by the network 12 and having a first alternating voltage, into an electric current having a second alternating voltage.

The electrical network 12 is an alternating network, such as a three phase network. The electrical network 12 is, for example, a medium voltage network, that is to say, having a voltage greater than 1000 V and less than 50 000 V. The first three phase voltage is thus a medium voltage. Alternatively, the electrical network 12 is a high voltage network, that is to say, having a voltage greater than 50 000 V.

The first panel 14 includes a plurality of inlets 22, each inlet 22 comprising one first 24A, 24B, one second 26A, 26B, and one third 28A, 28B input conductors. Each first, second, third input conductor 24A, 24B, 26A, 26B, 28A, 28B is connected to the electrical network by means of a respective 32 input circuit breaker. The three phase current flowing in the corresponding input conductors 24A, 24B, 26A, 26B, 28A, 28B has the first phase voltage.

The second panel 16 includes one first 34, one second 36, one third 38, and one fourth primary conductors 39 and a plurality N outlets 40A, 40B, ... 40N, that is to say, one first outlet 40A, 40B one second outlet, ..., one Nth outlet 40N, each outlet 40A, 40B, ... , 40N being configured for delivering a three phase voltage.

Each outlet 40A, 40B, 40N is a low voltage outlet, that is to say, with voltage being less than 1000 V. The second three phase voltage is thus low voltage. Alternatively, each outlet 40A, 40B, ... , 40N is a medium voltage outlet, that is to say, with voltage being higher than 1000 V and less than 50 000 V.

The first outlet 40A 42A has one first, one second 44A, one third 46A and one fourth 48A secondary conductors and three output circuit breakers 50 The first, second and third secondary conductors 42A, 42B, 42C are respectively connected to the first, second and third primary conductors 34, 36, 38 by means of a corresponding output circuit breaker 50. The fourth secondary conductor 48A is directly connected to the fourth primary conductor 39.

The primary output conductors 34, 36, 38 and the corresponding secondary output conductors 42A, 44A, 46A have substantially the same voltage, that is, respectively a first voltage U1, a second voltage U2 and a third voltage U3 corresponding to the three phases of the second three phase voltage.

The other outlets 40B, . . . 40N are identical to the first outlet 40A previously described above, and include the same elements in each case with the letter A being replaced by the corresponding letter B, . . . N pertaining to the references of the elements.

The electrical transformer 18 is configured for transforming the electric current coming from the electrical network having the first alternating voltage into the current delivered to the second panel 16 and having the second alternating voltage. The electrical transformer 18 includes a primary winding 52 connected to the first panel 14 and a secondary winding 54 connected to the second panel 16.

The computation system 20 is configured for calculating the electrical energy of the current flowing in each secondary output conductor 42A, 44A, 46A, 42B, 44B, 46B, . . . , 42N, 44N, 46N.

Figure 2:
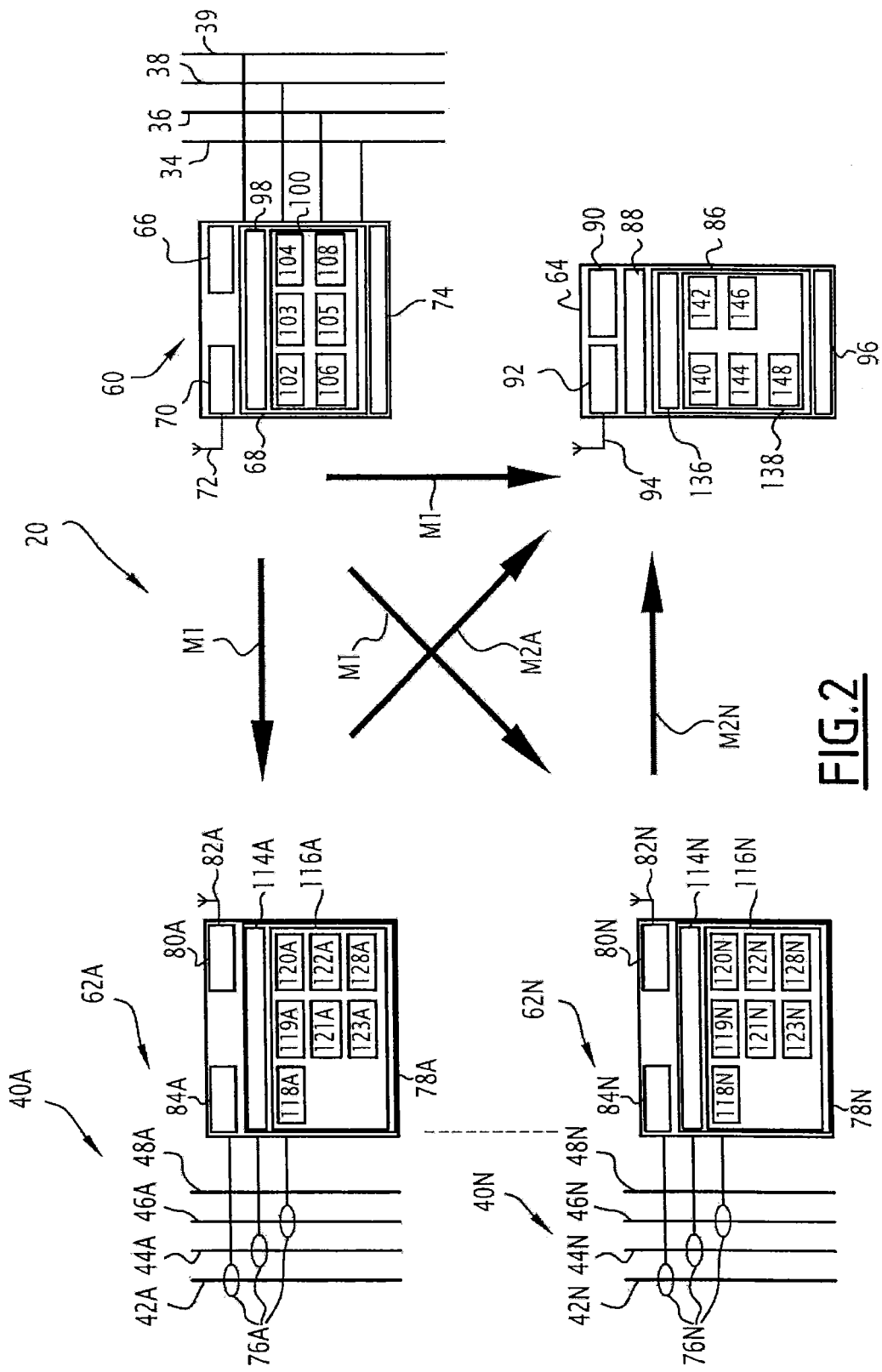
FIG. 2 is a schematic representation of the computation system shown in FIG. 1, the computation system comprising a first measuring device for measuring the voltage, a plurality of second measuring devices for measuring the intensity and a centralisation device.

The computation system 20, visible in FIG. 2, comprises a first device 60, a plurality N of second devices 62A, 62B, . . . , 62N, and a centralisation device 64.

The first device 60 includes a measuring member 66 for measuring the voltage of the current flowing in the corresponding primary conductor 34, 36, 38, and a data processing unit 68 for processing data. The first device 60 also includes a radio transmitter receiver 70, a radio antenna 72, and a power supply member 74 for supplying power to the measuring device, the data processing unit and the radio transmitter receiver.

The second device having the reference numeral 62A comprises, for each of the first 42A, second 44A and third 46A, secondary conductors, a current intensity sensor 76A for determining the intensity of the current flowing in the corresponding secondary conductor 42A, 44A, 46A. The second device 62A comprises a data processing unit 78A, a radio transmitter receiver 80A, and a radio antenna 82A. The second device 62A also comprises a power supply member 84A for supplying power to the data processing unit and the radio transmitter receiver. The second 62A device is identified by a unique number, also known as an identifier.

Other second devices 62B, . . . , 62N are identical to the second device 62A previously described above, and include the same elements in each case with the letter A being replaced by the corresponding letter B, . . . N pertaining to the references of the elements. Each of the other second devices 62B, . . . , 62N also has a unique identifier.

The centralisation device 64 comprises a data processing unit 86 for processing data, a database 88 and a human-machine interface 90 The centralisation device 64 comprises a radio transmitter receiver 92, a radio antenna 94, and a power supply member 96 for supplying power to the data processing unit, the database, the human machine interface and the radio transmitter receiver.

The measuring member 66 is configured for measuring the first voltage U1 of the phase flowing through the first primary conductor 34, the second voltage U2 of the phase flowing through the second primary conductor 36, and the third voltage U3 of the phase flowing through the third primary conductor 38. The measuring member 66 is also configured for measuring the frequency F of the three phase voltage flowing through the primary conductors 34, 36, 38.

The data processing unit 68 includes a processor 98 and a memory storage 100 configured for storing a software application 102 for measuring the voltages U1, U2, U3 via the measuring member 66 and a first software application 103 for sampling, with a predetermined sampling period $P_{sampl}$, of the value of the measured voltage U1, U2, U3. The samples of the measured voltage U1, U2, U3 are respectively denoted as $U1_{k,m}$, $U2_{k,m}$, $U3_{k,m}$ where k is an index of a sampling window of predetermined duration, associated with the sampling, and m is a sample index varying between 1 and $N_{sampl}$, with $N_{sampl}$ being an integer representing the number of voltage samples in the sampling window. The sampling window is, for example, chosen to be equal to the voltage period $P_{voltage}$, that is to say equal to the inverse of the voltage frequency F as measured by the measuring member 66.

The memory storage 100 is configured for storing a first software application 104 for determining a plurality of coefficients of a transform of samples $U1_{k,m}$, $U2_{k,m}$, $U3_{k,m}$ of each measured voltage, up to a row J whose value is greater than or equal to 1, preferably greater than or equal to 5, even more preferably equal to 17. By convention, the row that is equal to 1 corresponds to the fundamental of the transform.

The memory storage 100 is configured for storing a message transmission software application 105 for transmission of a first message M1 to each second device 62A, . . . , 62N and to the centralisation device 64. The time instants of transmission of two successive messages M1 are separated by a transmission period $P_{transmission}$. Each transmission period $P_{transmission}$ preferably has a predetermined value, for example equal to one second.

Each transmission period $P_{transmission}$ corresponds to a multiple of voltage periods $P_{voltage}$, the voltage period $P_{voltage}$ being equal to the inverse of the frequency F of the alternating voltage U1, U2, U3. The multiple preferably is an integer having a value greater than or equal to 2, and the transmission period $P_{transmission}$ corresponds then to an integer multiple of voltage periods $P_{voltage}$.

Alternatively, the multiple is a real number whose value is strictly greater than 1. According to this variant embodiment, a smoothing of the value of samples of the measured intensity will then be performed to take account of this non-integer multiple.

The memory storage 100 is configured for storing a second software application 106 for determining a set of at least one variable value representative of the measured voltage U1, U2, U3, said data set being determined based on the voltage value measured during a given transmission period $P_{transmission}$.

In the following of the description, each voltage period is also referenced by using the index k, given that the sampling window is preferably equal to the voltage period.

According to a first embodiment, the set of representative variable values associated with the measured voltage is determined further based on a correction coefficient $\sigma_i$ associated with the given transmission period $P_{transmission}$. The correction coefficient $\sigma_i$, is, for each phase having index i, a function of a representative value of the voltage $U_i$ only for each corresponding voltage period $P_{voltage}$ where said representative value is greater than a predetermined threshold value $\varepsilon$.

The memory storage 100 is configured for storing a distribution software application 108 for distribution of a single token to the second devices 62A, . . . , 62N in a successive manner.

The transform is, for example, a Fourier transform, and the first determination software application 104 is configured for calculating the real coefficient $ReU_{i,j,k}$, and imaginary coefficient $ImU_{i,j,k}$ of the Fourier series decomposition of the samples $Ui_{k,m}$ of each measured voltage Ui, where i is an index of the corresponding phase, for example equal to 1, 2 and 3 respectively, j is a row of the Fourier series decomposition, with j comprised between 1 and J, J being equal to the number of rows of said decomposition, k is the index of the corresponding voltage period $P_{voltage}$, with k comprised between 1 and K, K being equal to the number of voltage periods $P_{voltage}$ during a transmission period $P_{transmission}$. In the exemplary embodiment, the transmission period $P_{transmission}$ is equal to one second and the voltage period $P_{voltage}$ is equal to 20 ms, such that K is equal to 50.

Alternatively, the transform is a Laplace transform.

The first message M1 contains in particular the set of representative variable values determined by the second determination software application 106.

The first message M1 also contains the identifier of the second device that will be authorised to transmit its second message to the centralisation device 64 after receiving the first message M1. The identifier of the second device authorised to transmit its measurement related data is determined via the token distribution software application for distributing the unique token 108, the identifier of the device contained in the first message M1 making it possible to designate the second device to which the unique token has been assigned.

The radio transmitter receiver 70 is compliant with the ZigBee communication protocol based on the IEEE 802.15.4 standard. Alternatively, the radio transmitter receiver 70 is compliant with the IEEE 802.15.1-standard, or with the IEEE-802.15.2 standard, or even with the IEEE 802-11 standard, or any other proprietary radio protocol.

The radio antenna 72 is configured for transmitting radio signals to the antennas 82A, ..., 82N of the second devices and to the antenna 94 of the centralisation device, and also able to receive radio signals from said antennas 82A, ..., 82N, 94. In other words, the first device 60 is connected to each of the second devices 62A, ..., 62N and to the centralisation device 64 by means of a corresponding radio connection.

The power supply member 74 is configured for supplying electrical power to the measuring member 66, the data processing unit 68 and the radio transmitter receiver 70 from the three phase voltage flowing through the primary conductors 34, 36, 38.

Each current intensity sensor 76A of the second device 62A is configured for measuring a respective intensity from among a first intensity I1A flowing in the first secondary output conductor 42A, a second intensity I2A flowing in the second secondary output conductor 44A and a third intensity I3A flowing in the third secondary output conductor 46A.

Figure 3:
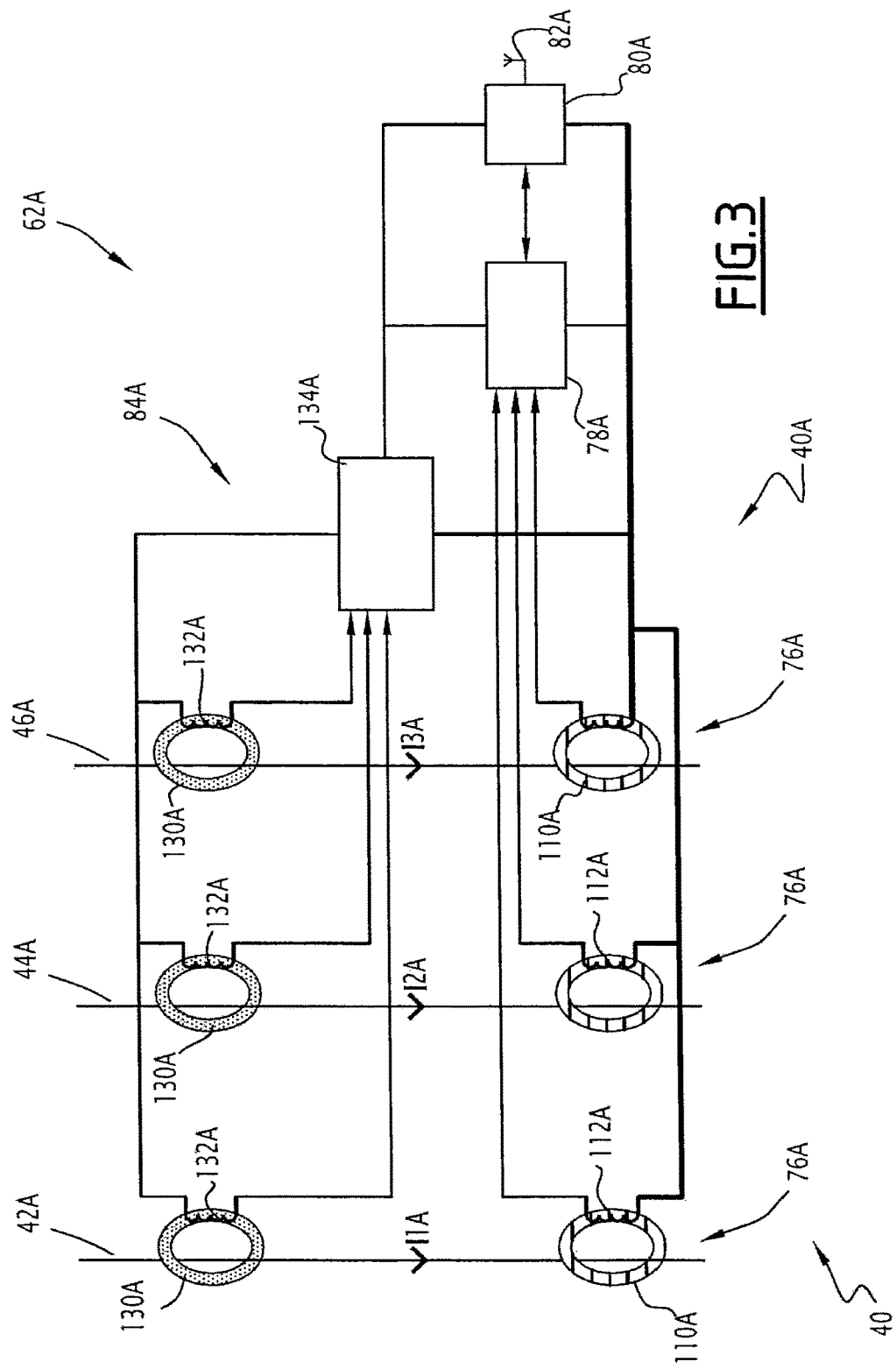
FIG. 3 is a schematic representation of the second device shown in FIG. 2.

Each intensity sensor 76A, also referred to as a current sensor, comprises a first toroidal coil 110A disposed around the corresponding secondary output conductor 42A, 44A, 46A and a first winding 112A arranged around the first toroidal coil, as shown in FIG. 3. The flow of current through the corresponding secondary output conductor is configured for generating an induced current proportional to the intensity of the current in the first winding 112A. The first toroidal coil 110A is a toroidal Rogowski coil. The first toroidal coil 110A is preferably a split toroidal core in order to facilitate its arrangement around the corresponding conductors.

The data processing unit 78A, visible in FIG. 2, includes a data processor 114A, and a memory storage 116A associated with the data processor and configured for storing a measurement software application 118A for measuring the measured values of the respective intensities and a second software application 119A for sampling, with a predetermined sampling period $P_{sampl}$, of the value of the first, second and third intensities I1A, I2A, I3A measured, and a messaging software application 120A for receiving the first message M1.

The samples of the first, second and third intensities I1A, I2A, I3A measured are respectively denoted as $I1A_{k,m}$, $I2A_{k,m}$, $I3A_{k,m}$ where k is the index of the sampling window of predetermined duration, associated with the sampling, and m is a sample index varying between 1 and $N_{sampl}$, with $N_{sampl}$ being an integer representing the number of voltage samples in the sampling window. The sampling window is, for example, chosen to be equal to the voltage period $P_{voltage}$, that is to say equal to the inverse of the voltage frequency F, this value of the frequency being contained in each first message M1 received.

The memory storage 116A is configured for storing a third software application 121A for determining a plurality of coefficients of a transform of samples $I1A_{k,m}$, $I2A_{k,m}$, $I3A_{k,m}$ up to a row J. The transform is, for example, a Fourier transform, and the third coefficient determination software application 121A is configured for calculating the real coefficient $ReI_{iA,j,k}$ and imaginary coefficient $ImI_{iA,j,k}$ of the Fourier series decomposition of the samples $IiA_{k,m}$ of each measured intensity IiA, where i is the index of the corresponding phase, j is the row of the Fourier series decomposition, with j comprised between 1 and J, k is the index of the corresponding voltage period $P_{voltage}$, with k comprised between 1 and K.

Alternatively, the transform is a Laplace transform.

The memory storage 116A is configured for storing a synchronisation software application 122A for synchronisation of the sampling of intensities I1A, I2A, I3A measured relative to the sampling of the measured voltage U1, U2, U3. By convention, the voltage period having index k equal to 1 corresponds to the temporal period during which the first message M1 is transmitted by the first device 60 and respectively received by each second device 62A, ..., 62N, and the voltage period having index k equal to 2 corresponds to the period at the beginning of which the synchronisation of samplings of voltage and intensities is performed.

The memory storage 116A is configured for storing a calculation software application 123A for calculating the electrical energy of the current flowing in the corresponding secondary conductor 42A, 44A, 46A, such as the active energy Ei.

Additionally, the memory storage 116A is configured for storing a message transmission software application 128A for transmitting a second message M2A to the centralisation device 64.

The second message M2A contains the identifier of the second device 62A, the active energy values $E_1$, $E_2$, $E_3$ for all three phases of the three phase voltage calculated by the calculation software application 123A.

In addition, the second message M2A contains the complex coefficients $ReI_{iA,j,k}$, $ImI_{iA,j,k}$ of the Fourier series decomposition of the three currents I1A, I2A, I3A.

The radio transmitter receiver 80A is of the same type as the radio transmitter receiver 70.

The radio antenna 82A, of the same type as the radio antenna 72, is configured for receiving radio signals from the antenna 72 of the first device and the antenna 94 of the centralisation device and also of transmitting radio signals to the antennas 72, 94.

The power supply member 84A, visible in FIG. 3, is configured for supplying power to the data processing unit 78A and the radio transmitter receiver 80A. The power supply member 84A comprises, for each of the first 42A, second 44A and third 46A secondary conductors, a second toroidal coil 130A arranged about the corresponding secondary conductor 42A, 44A, 46A and a second winding 132A arranged about the second toroidal coil. The flow of current through the corresponding secondary conductor 42A, 44A, 46A is configured for generating an induced current in the second winding 132A.

The power supply member 84A includes a converter 134A connected to each of the second windings 132A and configured for delivering a predetermined voltage to the data processing unit 78A and to radio transmitter receiver 80A. Each second toroidal coil 130A is a toroidal coil made of iron. Each second toroidal coil 130A is preferably a split toroidal core in order to facilitate its arrangement around the corresponding conductors.

In other words, the second device is self-powered 62A by means of the power supply member 84A having the second toroidal coils 130A configured for recovering the magnetic energy resulting from the flow of current in the corresponding secondary conductors 42A, 44A, 46A.

The elements of the other second devices 62B, . . . , 62N are identical to the elements of the first second device 62A previously described above, and include the same sub-elements in each case with the letter A being replaced by the corresponding letter B, . . . N pertaining to the references of the sub-elements.

The data processing unit 86 of the centralisation device, visible in FIG. 2, includes a data processor 136, and a memory storage 138 associated with the processor and configured for storing a messaging software application 140 for receiving the first and second messages M1, M2A, . . . , M2N, a data recording software application 142 for recording in the database 88 the data items contained in the received messages M1, M2A, . . . , M2N. The memory storage 138 is configured for storing a data processing software application 144 for processing said data items received, a display software application 146 for displaying data and a data transmission software application 148 for transmitting data to a remote server, not shown.

The human-machine interface 90 includes a display screen and a data input keyboard, not shown.

The radio transmitter receiver 92 is of the same type as the radio transmitter receivers 70, 80A, . . . , 80N.

The radio antenna 94, of the same type as the radio antennas 72, 82A, . . . , 82N, is configured for receiving radio signals originating from the antenna 72 of the first device and from the antennas 82A, . . . , 82N of the second devices and also of transmitting radio signals to said antennas 72, 82A, . . . , 82N.

Figure 4:
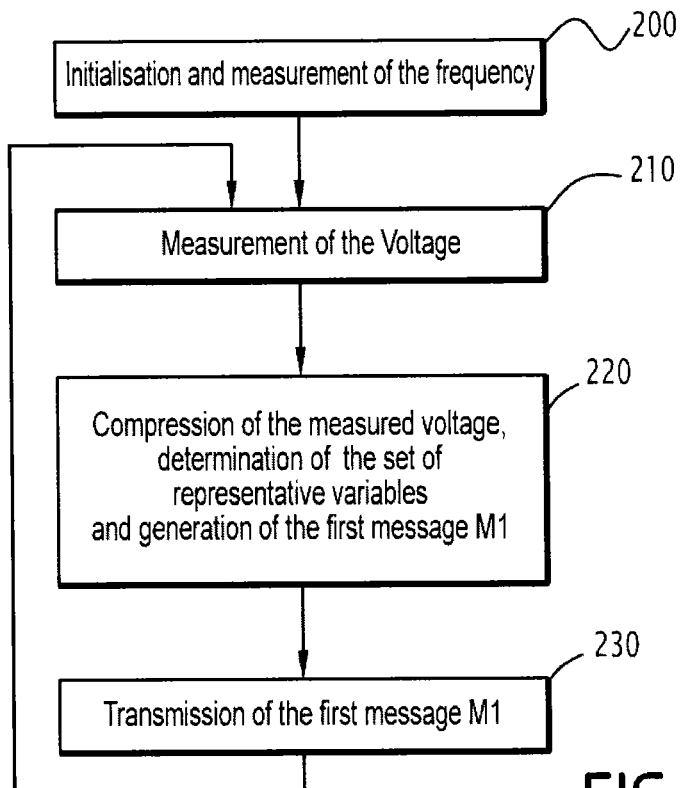
FIG. 4 is a flowchart of the steps of a calculation method according to the invention, carried out by the first device shown in FIG. 2.
Figure 6:
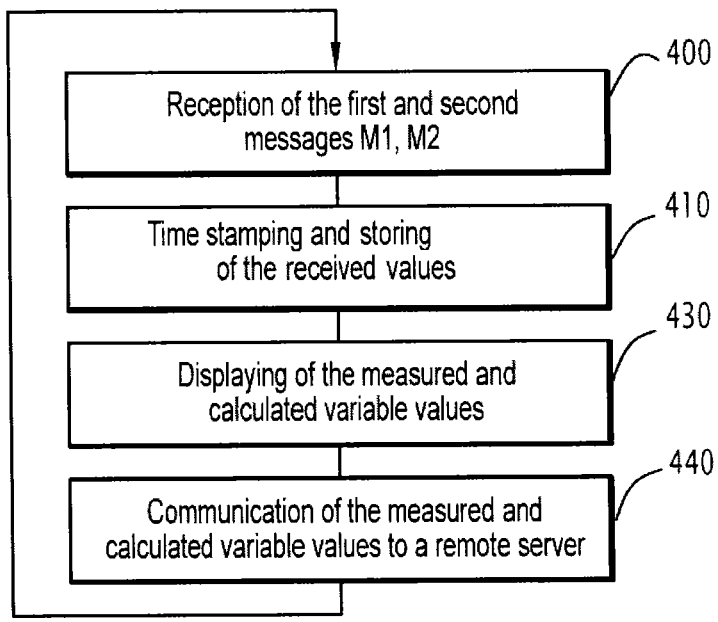
FIG. 6 is a flowchart of the steps of the same calculation method, carried out by the centralisation device shown in FIG. 2.
Figure 5:
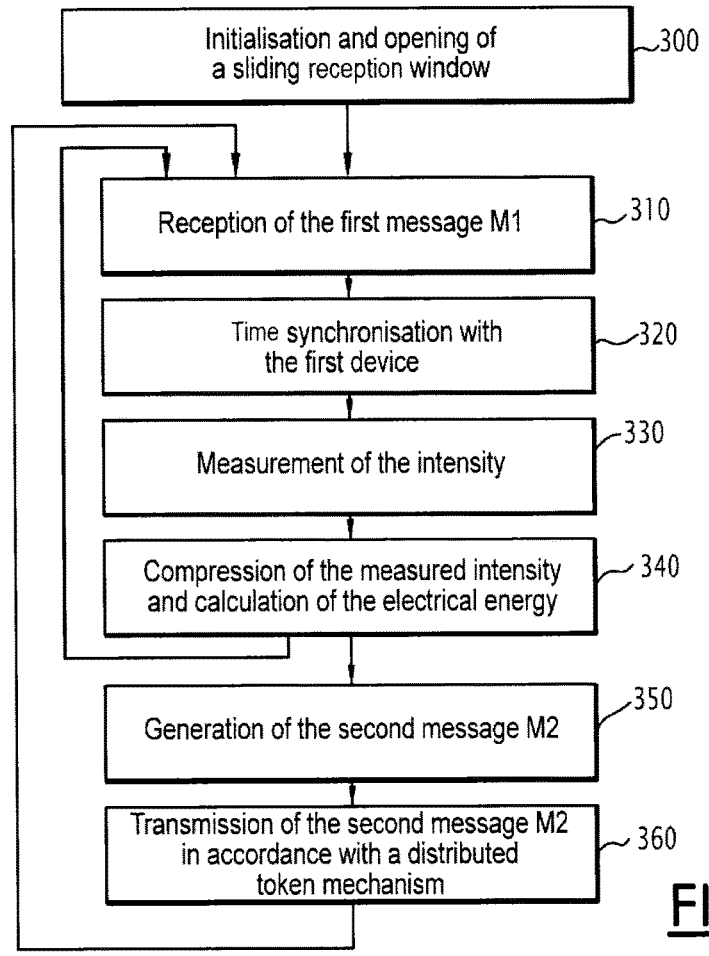
FIG. 5 is a flowchart of the steps of the same calculation method, carried out by the second devices shown in FIGS. 2 and 3.

The operation of the computation system 20 will now be explained with the aid of the FIGS. 4, 5 and 6 representing flowcharts of the steps of a method of calculation carried out respectively by the first device 60, by the second devices 62A, . . . , 62N and by the centralisation device 64.

As shown in FIG. 4, during a first step 200, the first device 60 is initialised and measures the frequency F of the three phase voltage flowing through the primary conductors 34, 36, 38 by means of the measurement software application 102. The frequency F of the three phase voltage is, for example, equal to 50 Hz.

The first device 60 then measures, during the step 210, the first, second and third voltages U1, U2, U3 via the measuring member 66 and the measurement software application 102.

The first sampling software application 103 then samples the measured values of the voltages U1, U2, U3. The frequency of sampling of the measured voltage, equal to the inverse of the sampling period $P_{sampl}$, is a multiple of the frequency F of said three phase voltage measured previously during the step 200. The period $P_{voltage}$ of the three phase voltage is equal to the period of the network, which is about 20 ms in Europe and about 16.66 ms in the United States of America. The voltage period $P_{voltage}$ corresponds to a multiple of the sampling period $P_{sampl}$.

During the step 210, in order to optimise the precision of the energy measurement, the period $P_{voltage}$ of the voltage is measured regularly, for example every 10 seconds, in order to take into account the variations over time thereof.

During the step 220, the first device 60 compresses the measured values of voltages U1, U2, U3 by determining the real coefficient $ReU_{i,j,k}$ and imaginary coefficient $ImU_{i,j,k}$ of the Fourier series decomposition of the samples $Ui_{k,m}$ of each measured voltage U1, U2, U3 by using its first coefficient determination software 104. This provides the ability to limit the amount of data transmitted via the radio links between the first device 60 and the second devices 62A, . . . , 62N.

The coefficients $ReU_{i,j,k}$, $ImU_{i,j,k}$ of the Fourier series decomposition are, for example, obtained by correlation operations on the samples of the measured values. More specifically, the real coefficient of the fundamental, denoted as $ReU_{i,1,k}$, is a correlation, over a duration equal to the period $P_{voltage}$ of the three phase voltage, between the samples $Ui_{k,m}$ of the signal of voltage Ui and a cosine of frequency equal to the frequency F of the three phase voltage, where Ui represents the voltage of the phase, i being equal to 1, 2 or 3. The imaginary coefficient of the fundamental, denoted as $ImU_{i,1,k}$, is a correlation over a duration equal to the period $P_{voltage}$ between the samples $Ui_{k,m}$ of the signal of voltage Ui and a sine of frequency equal to the frequency F.

The real coefficient of the harmonic of row j, denoted as $ReU_{i,j,k}$, j being comprised between 2 and J, is the correlation, over a duration equal to the period $P_{voltage}$, between the samples $Ui_{k,m}$ of the signal of voltage Ui and a cosine of frequency equal to j times the frequency F. the imaginary coefficient of harmonic of row j, denoted as $ImU_{i,j,k}$, is the correlation, over a duration equal to the period $P_{voltage}$, between the samples $Ui_{k,m}$ of the signal of voltage Ui and a sine of frequency equal to j times the frequency F.

In other words, the coefficients $ReU_{i,j,k}$ and $ImU_{i,j,k}$ satisfy the following equations, j being comprised between 1 and J:

$$ReU_{i,j,k} = \sum_{m=1}^{Nsampl} Ui_{k,m} \times \cos(2 \times \Pi \times F_{voltage} \times j \times m \times T) \quad (1)$$

$$ImU_{i,j,k} = \sum_{m=1}^{Nsampl} Ui_{k,m} \times \sin(2 \times \Pi \times F_{voltage} \times j \times m \times T) \quad (2)$$

where T represents the sampling period, also denoted as $P_{sampl}$.

Alternatively, the coefficients $ReU_{i,j,k}$ and $ImU_{i,j,k}$ are obtained by Fast Fourier Transform, also known by the abbreviation FFT.

The first determination software application 104 thus calculates the complex coefficients $ReU_{i,j,k}$ and $ImU_{i,j,k}$ of the Fourier series decomposition of the three voltages U1, U2, U3 for the fundamental and the harmonics 2 to J.

The second determination software application 106 then determines during the step 220 the set of representative variable values, the latter being according to the first embodiment determined based on the correction coefficient $\sigma_i$ associated with the given transmission period $P_{transmission}$. The correction coefficient $\sigma_i$ is a function of a value representative of the voltage $U_i$ for each corresponding voltage period of $P_{voltage}$ where said representative value is greater than the predetermined threshold value $\varepsilon$.

The predetermined threshold value $\varepsilon$ is, for example, comprised between 0.005 and 0.10 times the nominal value Un of the voltage, preferably between 0.01 and 0.05 times the nominal value Un of the voltage, more preferably equal to 0.02 times the nominal value Un of the voltage.

Said representative value of the voltage is preferably the value of the modulus of the fundamental of the Fourier series decomposition of the voltage, the modulus of the fundamental being denoted as $\|U_{i,1,k}\|$.

The correction coefficient $\sigma_i$ satisfies, for example, for each phase having index i, the following equation:

$$\sigma_i = \frac{1}{k_{max}} \times \sum_{\forall k / \|U_{i,1,k}\| \geq \varepsilon} \frac{\|U_{i,1,k}\|}{\|U_{i,1,k_0}\|} \quad (3)$$

where k is the index of the voltage period $P_{voltage}$, with k lying between 1 and K, K being equal to the number of voltage periods $P_{voltage}$ during a transmission period $P_{transmission}$, $k_0$ is the index of a voltage period selected from the plurality of voltage periods $P_{voltage}$. The value of the index k0 is preferably equal to 2, because this is the first period placed right after the synchronisation and it is thus the period over which the discrepancies in the clocks have the least impact over the precision of the calculations.

$k_{max}$ is the number of voltage periods for which the modulus of the fundamental of the Fourier series decomposition of the voltage is greater than the predetermined threshold values during the given transmission period $P_{transmission}$, and $\|U_{i,1,k}\|$, and $\|U_{i,1,k_0}\|$ respectively, represent the modulus of the fundamental of the Fourier series decomposition of the voltage for the phase having index i and the voltage period having index k, and respectively, the selected voltage period having index $k_0$.

The correction coefficient $\sigma_i$ then provides the ability to take into account the contribution of voltage values measured for all the voltage periods $P_{voltage}$ over the course of a given transmission period $P_{transmission}$ from the moment when the threshold value E has been exceeded, and not only that for the selected voltage period having index $k_0$.

The correction coefficient $\sigma_i$ is, for example, applied to the complex coefficients $ReU_{i,j,k0}$ and $ImU_{i,j,k0}$ with j having a value between 1 and J for the selected voltage period having index $k_0$.

The set of representative variable values associated with the measured voltage then includes the modified complex coefficients, denoted as $ReU_{i,j}$ and $ImU_{i,j}$ obtained by using the following equations:

$$ReU_{i,j} = \sigma_i \times ReU_{i,j,k_0} \quad (4)$$

$$ImU_{i,j} = \sigma_i \times ImU_{i,j,k_0} \quad (5)$$

The set of representative variable values preferably consists of said modified complex coefficients $ReU_{i,j}$ and $ImU_{i,j}$.

The data field of the first message M1 then contains in particular the modified complex coefficients $ReU_{i,j}$ and $ImU_{i,j}$ with j having a value between 1 and D forming the set of representative variable values determined.

Finally, during the step 230, the first device 60 transmits, via its message transmission software application 105, the first message M1 to each of the second devices 62A, ..., 62N as well as to the centralisation device 64.

The first device 60 in addition also launches during this step 230, a first timer countdown equal to a reference duration Df, starting from the start time of transmission of the first message M1, also referred to as transmission top Te of the first message M1. When this first timer has run out, the first device 60 will then begin sampling the measured values of the three voltages U1, U2, U3, that is to say, at a sampling start time Tm equal to the transmission start time Te plus the reference duration Df. The sampling, by the second device 62A, of the measured values of the three intensities I1A, I2A, I3A will also start at this sampling start time Tm, as will be described in more detail here below with regard to the step of synchronisation 320.

The reference duration Df has a predetermined value, for example substantially equal to 6 ms. The value of the reference duration Df is known to both the first device 60 as well as the second device 62A, and is selected to be greater than the time period required for the transmission and reception of the first message M1. In the example of embodiment described, the value of the reference duration Df is stored, prior to the initial step 200, in the memory 100 of the first device and in the memory 116A of the second device 62A.

The first message M1 includes a header field, also referred to as preamble, a SFD field (abbreviation for Start of Frame Delimiter), a PHR field (abbreviation for Physical Header), a data field and a CRC field (abbreviation for Cyclic Redundancy Check). The preamble has a size of 4 bytes, the SFD and PHR fields each have a size of one byte, the data field is of variable size, denoted by n bytes, and CRC field has a size of 2 bytes. In the example of embodiment shown in FIG. 7, the first message M1 is constituted of the header field, the SFD field, the PHR field, the data field and the CRC field.

The data field of the first message M1 contains in particular the set of representative variables previously determined during the step 220, and the identifier of the second device that will be authorised to transmit its second message to the centralisation device 64 after the reception of the first message M1. The identifier of the second device authorised to transmit its measurement related information is determined via the unique token distribution software application 108, the identifier of the device contained in the first message M1 making it possible to designate the second device to which the unique token has been assigned.

After transmission of the first message M1, the first device 60 returns to the step 210 in order to again measure the voltage U1, U2, U3 of the phases of the three phase voltage flowing through the primary conductors 34, 36, 38.

The steps, visible in FIG. 5, of the calculation method carried out by the second devices 62A, ..., 62N will now be described for the second device with the reference 62A.

During the step 300, the second device 62A is initialised and opens a sliding window for receiving the first message M1 via its messaging software application 120A. The receiving window is a window with a duration of a few tens of milliseconds that the second device 62A causes to slide over time.

Figure 7:
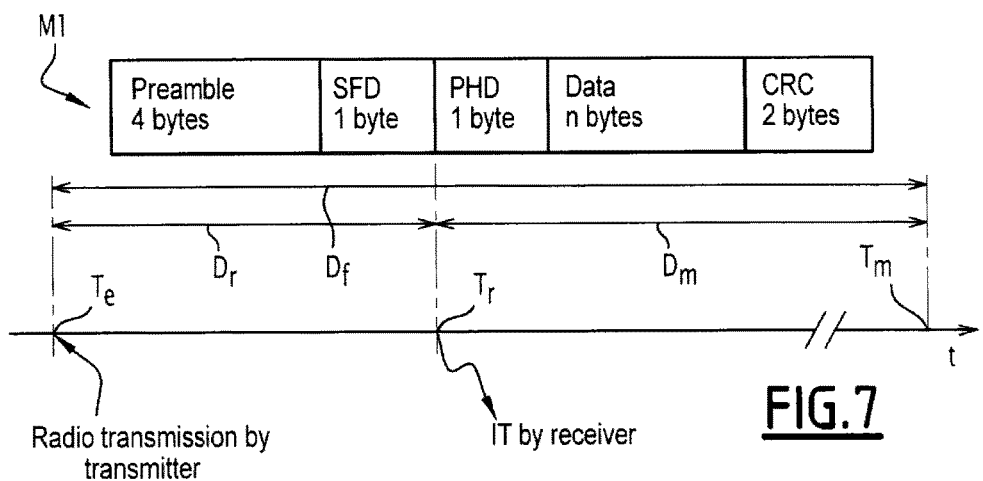
FIG. 7 is a timeline chart showing the time instants of transmission and reception of a first message, the latter being transmitted by the first device to the second devices.

Upon receiving the first message M1, the second device 62A detects the time instant Tr of reception of the SFD field, the receipt of the SFD field leading to the triggering of an interruption by the radio receiver of the second device 62A, as represented in the FIG. 7.

The second device 62A then proceeds to the step 320 of temporal synchronisation with the first device 60. The detection of the reception time Tr makes it possible to calculate, by using the synchronisation software application 122A, the time instant Tm os start of sampling of the measured values of the three intensities I1A, I2A, I3A. The sampling start time Tm is in fact equal to the reception time Tr plus a duration of synchronisation Dm, the synchronisation duration Dm being equal to the reference duration Df less one duration of radio transmission Dr, as shown in FIG. 7. The radio transmission duration Dr is a value dependent on the radio transmitter receiver 70 and the radio transmitter receiver 80A. The radio transmission duration Dr corresponds to the time period between the transmission start time Te and the reception time Tr.

The radio transmission duration Dr is for example substantially equal to 0.6 ms, and is known by the second device 62A. In the example of embodiment described, the value of the radio transmission duration Dr is stored, prior to the step 300, in the memory 116A of the second device 62A.

The second device 62A then launches, starting from the reception time Tr and via the synchronisation software application 122A, a second timer countdown equal to the duration of synchronisation Dm, the value of the duration of synchronisation Dm being calculated by subtracting the value of the radio transmission duration Dr from the value of the reference duration Df, the value of the radio transmission duration Dr and the value of the reference duration Df being stored in the memory storage 116A as previously described above.

The first device 60 would have also launched during the step 230, the first timer countdown equal to the reference duration Df, such that the first device 60 and second device 62A would start simultaneously sampling the measured voltage values and the measured intensity values respectively, when the first and second timers launched during the steps 230 and 320 would have run out, that is to say, at the sampling start time Tm.

By convention, the voltage period corresponding to the transmission of the first message M1 is the period having index k equal 1. When the first message M1 has also been received during the course of the voltage period having index k equal to 1, the start time of sampling following the synchronisation corresponds to the beginning of the voltage period having index k equal to 2.

The voltage period $P_{voltage}$ is recalculated, by the second sampling software application 119A, upon each instance of reception of the first message M1 with use of the value of voltage frequency F contained in the first message M1.

During the step 320, the synchronisation software 122A initialises, to the date of reception of the first message M1, a counter designed to be incremented up to a value corresponding to the period of transmission of the first message $P_{transmission}$. The second device 62A automatically returns to the step of receiving 310 about one millisecond before the expected reception of the subsequent first message M1.

If the first message M1 is not detected by the second device 62A, the receiving window is closed and no synchronisation is performed. The counter is then incremented for a new attempt at synchronisation on the probably subsequent message M1.

The second device 62A then measures during the step 330 and by means of the current sensors 76A and measurement software 118A thereof, each of the first, second and third intensities I1A, I2A, I3A.

The second sampling software 119A then samples the measured values of the three intensities I1A, I2A, I3A, the sampling start time Tm having been calculated during the previous step 320 in order to ensure the time synchronisation of the current intensity sensor 76A relative to the measuring member for measuring the voltage 66.

The third determination software application 121A then compresses the measured values of intensities I1A, I2A, I3A during the step 340. The third determination software application 121A calculates, for example, real coefficient $ReI_{iA,j,k}$, and imaginary coefficient $ImI_{iA,j,k}$, of the Fourier series decomposition of the samples, $IiA_{k,m}$ of each measured intensity I1A, I2A, I3A of the three phases in a manner similar to the calculation, described for the step 220, of the complex coefficients $ReU_{i,j,k}$, $ImU_{i,j,k}$ of the Fourier series decomposition of the voltages.

The real coefficient of the fundamental, also denoted as $ReI_{iA,1,k}$, is thus a correlation, over a duration equal to the period $P_{voltage}$ of the three phase voltage, between the samples of the signal of the intensity IiA and a cosine of frequency equal to the frequency F of the three phase voltage, where IiA represents the intensity of the phase number i, i being equal to 1, 2 or 3. The imaginary coefficient of the fundamental, also denoted as $ImI_{iA,1,k}$, is a correlation over a duration equal to the period $P_{voltage}$, between the samples of the signal of the intensity IiA and a sine of frequency equal to the frequency F.

The real coefficient of harmonic j, denoted as $ReI_{iA,j,k}$, j being comprised between 2 and J, is a correlation over a duration equal to the period $P_{voltage}$, between the samples of the signal of the intensity IiA and a cosine of frequency equal to j times the frequency F. The imaginary coefficient of the harmonic j, denoted as $ImI_{iA,j,k}$, j being comprised between 2 and J, is the correlation, over a duration equal to the period $P_{voltage}$, between the samples of the signal of the intensity IiA and a sine of frequency equal to j times the frequency F.

The coefficients $ReI_{iA,j,k}$ and $ImI_{iA,j,k}$ then satisfy the following equations:

$$ReI_{iA,j,k} = \sum_{m=1}^{N_{sampl}} IiA_{k,m} \times \cos(2 \times \Pi \times F_{voltage} \times j \times m \times T) \quad (6)$$

$$ImI_{iA,j,k} = \sum_{m=1}^{N_{sampl}} IiA_{k,m} \times \sin(2 \times \Pi \times F_{voltage} \times j \times m \times T) \quad (7)$$

The calculation software application 123A then calculates in a periodic manner the active energy $E_1$, $E_2$, $E_3$ for each of three phases based on the set of determined representative variable values, previously received from the first device 60 via the first message M1, and the values of the intensities I1A, I2A, I3A measured by the current sensors 76A. The period for calculating the active energies $E_1$, $E_2$, $E_3$ is equal to the period of transmission of the first message $P_{transmission}$, which is for example 1 second.

In order to calculate the active energies $E_1$, $E_2$, $E_3$, the calculation software 123A calculates, for the period $P_{voltage}$ having index k equal to $k_0$, the active power $P_{i,j,k0}$ for each phase number i, i being equal to 1, 2 or 3, and for each row j comprised between 1 and J, by using the following equation:

$$P_{i,j,k_0} = \frac{\lfloor ReU_{i,j} \times ReI_{iA,j,k_0} + ImU_{i,j} \times ImI_{iA,j,k_0} \rfloor}{2} \quad (8)$$

The calculation software 123A also determines for the period $P_{voltage}$ having index k equal to $k_0$, the reactive power $Q_{i,j,k0}$ for each phase number i, i being equal to 1, 2 or 3, and for each row j comprised between 1 and J, by using the following equation:

$$Q_{i,j,k_0} = \frac{\lfloor \text{Im}U_{i,j} \times \text{Re}I_{iA,j,k_0} - \text{Re}U_{i,j} \times \text{Im}I_{iA,j,k_0} \rfloor}{2} \quad (9)$$

The calculation software application 123A also determines the phase shift $\varphi_{i,j,k0}$, also denoted as $\varphi_{j,i}$, between the harmonic of the voltage and the harmonic of the current for the period $P_{voltage}$ having index k equal to $k_0$, preferably equal to 2, for each phase number i, i being 1, 2 or 3, and for each row j comprised between 1 and J, by using the following equation:

$$\varphi_{i,j} = \varphi_{i,j,k_0} = \arctan\left(\frac{Q_{i,j,k_0}}{P_{i,j,k_0}}\right) \quad (10)$$

The calculation software application 123A then determines an effective voltage $U_{i,j}$eff for each phase number i, i being 1, 2 or 3, and for each row j comprised between 1 and J, by using the following equation:

$$U_{i,j}\text{eff} = \sqrt{\frac{(\text{Re}U_{i,j})^2 + (\text{Im}U_{i,j})^2}{2}} \quad (11)$$

This value of effective voltage is then a value corresponding to all of the voltage periods $P_{voltage}$ from the time instant when the threshold value ε is exceeded for the given transmission period $P_{transmission}$.

The calculation software 123A then determines an effective current $I_{i,j,k}$eff for each period $P_{voltage}$ having index k comprised between 1 and K, for each phase number i, i being equal to 1, 2 or 3, and for each row j comprised between 1 and J, by using the following equation:

$$I_{i,j,k}\text{eff} = \sqrt{\frac{(\text{Re}I_{i,j,k})^2 + (\text{Im}I_{i,j,k})^2}{2}} \quad (12)$$

The active energy $E_i$ of each phase number i is finally calculated via the following equations:

$$E_i = \sum_{j=1}^{J} E_{i,j} \quad (13)$$

$$E_{i,j} = \sum_{k=1}^{K} P_{i,j,k} \times P_{transmission} \quad (14)$$

$$E_{i,j} = \sum_{k=1}^{K} [U_{i,j}\text{eff} \times I_{i,j,k}\text{eff} \times \cos(\varphi_{i,j})] \times P_{transmission} = \quad (15)$$

$$U_{i,j}\text{eff} \times \cos(\varphi_{i,j}) \times P_{transmission} \times \sum_{k=1}^{K} I_{i,j,k}\text{eff}$$

Figure 8:
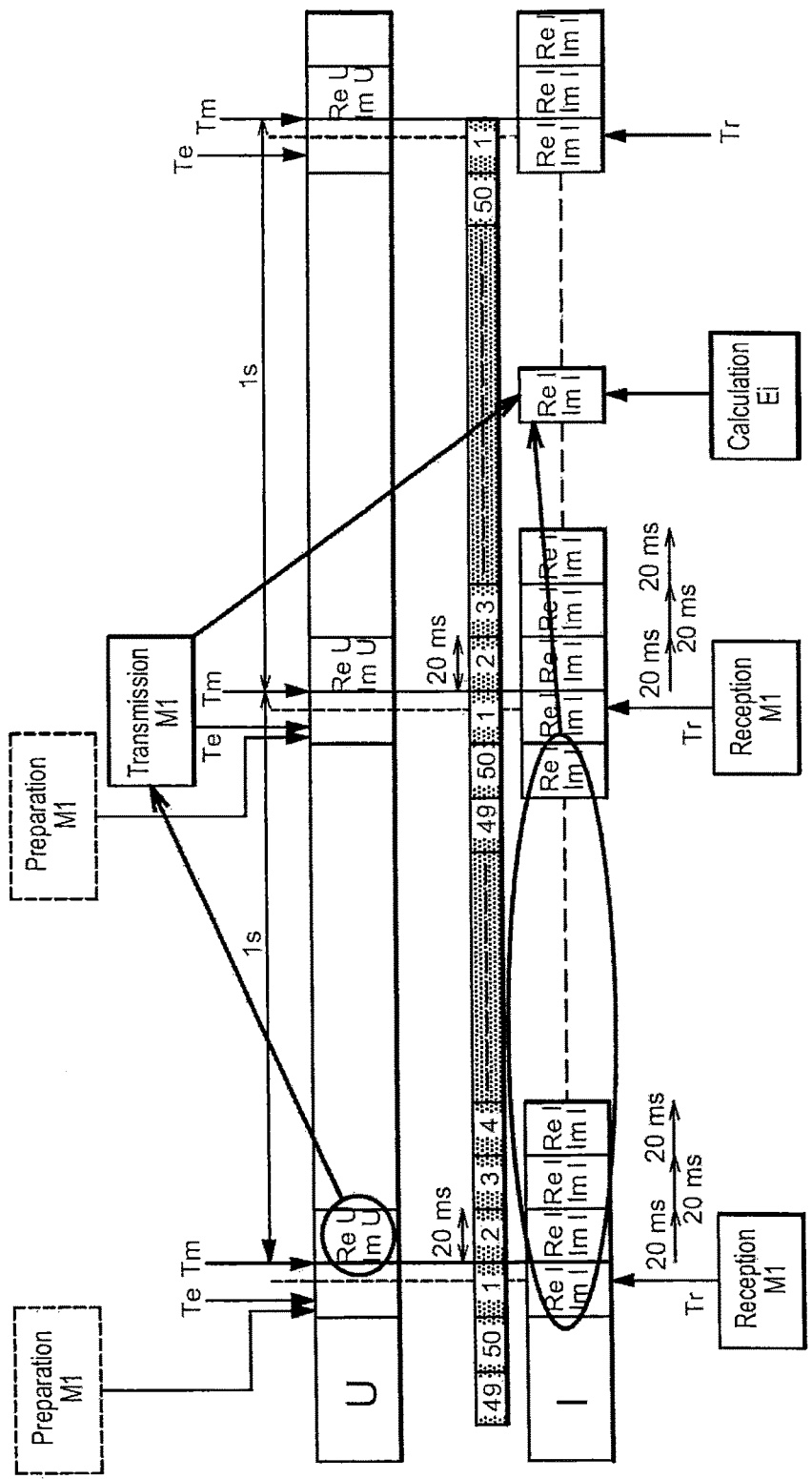
FIG. 8 is a timeline chart representing the time periods for which the coefficients of a Fourier series decomposition of the voltage and intensity respectively, are determined and also the time instants respectively of preparation of the first message, transmitting of the first message and calculation of the electrical energy.

The calculation of the active energies $E_1$, $E_2$, $E_3$ is performed at any time over the course of a transmission period $P_{transmission}$ between two instances of reception of the message M1, the information needed for the calculation being contained in the first message M1 received previously, with respect to the information related to the voltage, or in the memory 116A of the second device 62A, given that the values relative to the voltage or intensities taken into account correspond to the preceding transmission period $P_{transmission}$. In the example shown in FIG. 8, the calculation of the active energies $E_1$, $E_2$, $E_3$ is performed substantially in the middle of the transmission period.

The second device 62A then generates, during the step 350, its second Message M2A. The second message M2A contains the identifier of the second device 62A, the values of the active energies $E_1$, $F_2$, $E_3$ for all three phases of the three phase voltage and the complex coefficients $\text{Re}I_{iA,j,k}$, and $\text{Im}I_{iA,j,k}$ of the Fourier series decomposition of the three currents I1A, I2A, I3A up to the harmonic J.

In addition, the second message M2A contains the root mean squared values, also denoted as RMS, of the currents I1A, I2A, I3A of the three phases, as well as the terms $P_{i,j,k0}$ and $Q_{i,j,k0}$ for all three phases.

Considering the assumption where the identifier of the second device 62A were contained in the first message M1 received previously, the second device 62A would then transmit during the step 360 its second message M2A by using its transmission software 128A. In the contrary case, the second device 62A will return directly to the step 310 of receiving the first message M1, and will transmit its second message M2A where the first message M1 were to contain its identifier then indicating that the unique token had been assigned thereto so as to authorise it to transmit its second message M2A.

After the step of message transmission 360 in the case where the token had been assigned to the second device 62A, or indeed otherwise after the step 350, the second device 62A would return to the step of receiving 310 if the counter has reached the value corresponding to the transmission period $P_{transmission}$, or indeed otherwise to the measuring step 330.

The steps of the calculation method carried out by the other second devices 62B, . . . , 62N are identical to the steps 300 and 360 described above for the second device with the reference numeral 62A, and in addition are carried out simultaneously among all the second devices 62A, . . . , 62N due to the temporal synchronisation performed by using the first message M1.

During the step of transmission 360, the sole second device from among all of the second devices 62A, . . . , 62N authorised to transmit its second message is the second device whose identifier is contained in the first message M1 received during the preceding step of receiving 310. The distribution software application 108 determines based on an ascending order the identifiers contained in the first message M1 in order to successively assign the unique token to the second devices 62A, . . . , 62N. In other words, each second device 62A, . . . , 62N transmits every N seconds its respective second message M2A, . . . , M2N.

As shown in the FIG. 6, during the step 400, the centralisation device 64 receives, by using its reception software application 140, the first message M1 from the first device 60 and the second message from the second device authorised to transmit in accordance with the distributed token mechanism, for example the message M2A.

During the step 410, the centralisation device 64 subsequently records in its database 88 the values received and contained in the first message M1 and in the second message M2A via its data recording software 142. In addition, the data processing software 144 performs time stamping of the recorded data.

The variable values measured and calculated by the computation system are then displayed on the screen of the human machine interface 90 of the centralisation device via the display software 146 during the step 430. These variable values are displayed in the form of numerical values and/or as curves.

The centralisation device 64 finally transmits, during the step 440 and via the transmission software application 148, these measured and calculated variable values to the remote server, not shown. The remote server is configured for performing centralised management of measured and calculated variable values for each computation system 20.

Upon completion of the step 440, the centralisation device 64 returns to the step 400 in order to receive the subsequent first message M1 from the first device and the second message from the second device authorised to transmit the subsequent time in accordance with the distributed token mechanism, for example the message M2A.

The computation system 20 according to the invention thus provides the ability to calculate the active energies $E_1$, $E_2$, $E_3$ directly over the given transmission period $P_{transmission}$ and based on the set of variable values representative of the measured voltage. The computation system 20 also provides the ability, by means of the determination of correction coefficient $\sigma_i$ to take into account the contribution of the values of measured voltage for all voltage periods $P_{voltage}$ over the course of a given transmission period $P_{transmission}$ starting from the time instant where the threshold value ε is exceeded, not only the contribution of values of the voltage measured for the selected voltage period having index $k_0$.

The computation system 20 according to the invention is thus more accurate than the computation system as per the state of the art.

The computation system 20 according to the invention further provides the ability to obtain a very accurate measurement of the active energies $E_1$, $E_2$, $E_3$ for the three phase of the three phase current, due to the temporal synchronisation of each current sensor 76A relative to the measuring member for measuring voltage 66.

The temporal synchronisation is very precise, the synchronisation offset measured being in the order of plus or minus 400 nanoseconds with the current technology of the radio transmitter receivers 70, 80A, . . . , 80N, 92 and the data processing units 68, 78A, . . . , 78N, 86.

All the devices 60, 62A, . . . , 62N, 64 are interconnected amongst themselves via radio links by means of their respective radio transmitter receiver 70, 82A, . . . , 82N, 92, which makes it possible to facilitate the installation of the computation system 20 in the transformer substation 10.

The compression of data relating to the voltages and intensities measured by means of the determination software application 104, 124A, . . . , 124N and the transmission, via the first message M1, of the set of representative variable values associated with the measured voltage, instead of coefficients associated with the voltage for all the voltage periods over the course of the given transmission period, makes it possible to limit the amount of data transmitted via the radio links, and thus to limit the energy consumption of the computation system 20 itself. This in addition also provides the ability to reduce the sensitivity of the computation system 20 to radio disturbance of the interference kind or electromagnetic compatibility disturbance, also referred to as EMC disturbance.

The computation system 20 according to a second embodiment of the invention will now be described. For this second embodiment, the elements that are identical to the first embodiment, previously described above, have been identified by identical reference numerals and shall not be described again.

According to this second embodiment, the second determination software 106 is in addition configured for determining, for each phase, an angular deviation $\alpha_i$ based on a ratio for at least one voltage period $P_{voltage}$, the ratio being equal to the imaginary coefficient of the fundamental of a Fourier series decomposition of the voltage over said voltage period $P_{voltage}$ divided by the real coefficient of said fundamental of the voltage.

This angular deviation $\alpha_i$ then provides the ability to take into account a possible eventual variation in the value of the voltage period $P_{voltage}$ such that the sampling windows would then be slightly offset in relation to the exact value of the voltage period $P_{voltage}$.

The calculation software 123A is then configured for calculating the active energies $E_i$ based in addition on the angular deviation $\alpha_i$.

The angular deviation $\alpha_i$ satisfies, for example, for each phase having index i, the following equations:

$$\alpha_i = \frac{1}{K-1}\sum_{k=1}^{K-1}\alpha_{i,k} \text{ and} \tag{16}$$

$$\alpha_{i,k} = \varphi_i(k+1) - \varphi_i(k) \forall k \in [1; K-1]$$

$$\text{that is } \alpha_i = \frac{\varphi_i(K) - \varphi_i(1)}{K-1} \tag{17}$$

$$\text{with } \varphi_i(k) = \arctan\left(\frac{\text{Im}U_{i,1,k}}{\text{Re}U_{i,1,k}}\right) \tag{18}$$

where i is the index of the corresponding phase, k is the index of the voltage period $P_{voltage}$, with k comprised between 1 and K, K being equal to the number of voltage periods $P_{voltage}$ occurring during a transmission period $P_{transmission}$, and $U_{i,1,k}$ represents the fundamental of the voltage for the phase having index i and the voltage period having index k.

According to the second embodiment, the calculation software application 123A then calculates the real and imaginary coefficients of a Fourier series decomposition of the voltage, and subsequently the active powers, in the following manner and based on the index k of the voltage period $P_{voltage}$.

According to the second embodiment, the selected voltage period $P_{voltage}$ is the period having index equal to 2, and the value of the index $k_0$ is then equal to 2.

For the period $P_{voltage}$ having index k=2, the real and imaginary coefficients are equal to the modified complex coefficients $\text{Re}U_{i,j}$ and $\text{Im}U_{i,j}$ contained in the first message M1 received, and then satisfy the following equations:

$$\text{Re}U_{i,j,2} = \text{Re}U_{i,j}$$

$$\text{Im}U_{i,j,2} = \text{Im}U_{i,j} \tag{19}$$

The active power $P_{i,j,2}$ for each phase number i, i being equal to 1, 2 or 3, and for each row j comprised between 1 and J, is then calculated via the following equation:

$$P_{i,j,2} = \frac{\lfloor \text{Re}U_{i,j,2} \times \text{Re}I_{iA,j,2} + \text{Im}U_{i,j,2} \times \text{Im}I_{iA,j,2} \rfloor}{2} \quad (20)$$

For the period $P_{voltage}$ having index k varying between 3 and K, the real and imaginary coefficients satisfy the following equations:

$$\text{Re}U_{i,j,k} = \cos(j \times \alpha_i) \times \text{Re}U_{i,j,k-1} - \sin(j \times \alpha_i) \times \text{Im}U_{i,j,k-1}$$

$$\text{Im}U_{i,j,k} = \cos(j \times \alpha_i) \times \text{Im}U_{i,j,k-1} + \sin(j \times \alpha_i) \times \text{Re}U_{i,j,k-1} \quad (21)$$

The active power $P_{i,j,k}$ with the index k varying between 3 and K, and for each phase number i, i being equal to 1, 2 or 3, and for each row j comprised between 1 and J, is then calculated via the following equation:

$$P_{i,j,k} = \frac{\lfloor \text{Re}U_{i,j,k} \times \text{Re}I_{iA,j,k} + \text{Im}U_{i,j,k} \times \text{Im}I_{iA,j,k} \rfloor}{2} \quad (22)$$

Finally, for the voltage period having index k equal to 1, the real and imaginary coefficients satisfy the following equations:

$$\text{Re}U_{i,j,1} = \cos(-j \times \alpha_1) \times \text{Re}U_{i,j,2} - \sin(-j \times \alpha_i) \times \text{Im}U_{i,j,2}$$

$$\text{Im}U_{i,j,1} = \cos(-j \times \alpha_i) \times \text{Im}U_{i,j,2} + \sin(-j \times \alpha_i) \times \text{Re}U_{i,j,2} \quad (23)$$

In an analogous manner, the active power $P_{i,j,1}$ for the voltage period having index k equal to 1, for each phase number i, i being 1, 2 or 3, and for each row j comprised between 1 and J, is then calculated via the following equation:

$$P_{i,j,1} = \frac{\lfloor \text{Re}U_{i,j,1} \times \text{Re}I_{iA,j,1} + \text{Im}U_{i,j,1} \times \text{Im}I_{iA,j,1} \rfloor}{2} \quad (24)$$

The calculation software 123A then calculates the active energy $E_i$ of each phase number i via the equations (13) and (14) previously described above.

The other steps of the calculation method according to the second embodiment are identical to those previously described above for the first embodiment, and shall not be described again.

The advantages of this second embodiment include in particular the advantages of the first embodiment, and these latter shall not be described again.

The computation system 20 according to this second embodiment also provides the ability, by means of the determination of the angular deviation $\alpha_i$, to compensate for any possible eventual variation in the value of the voltage period $P_{voltage}$ which would result in an offset of the sampling windows in relation to the exact value of the voltage period $P_{voltage}$.

The computation system 20 according to the invention is thus more accurate.

In the second embodiment previously described above, for the period $P_{voltage}$ having index k=2, the real and imaginary coefficients are chosen to be equal to the modified complex coefficients $\text{Re}U_{i,j}$ and $\text{Im}U_{i,j}$ contained in the first message M1 received. In other words, the second embodiment previously described above implements both the determination of the correction coefficient $\sigma_i$ as well as determination of the angular deviation $\alpha_i$.

The person skilled in the art will understand that in a variant embodiment the determination of the angular deviation $\alpha_i$ is configured for being implemented independently of the determination of the correction coefficient $\sigma_i$. Where applicable, for the period $P_{voltage}$ having index k=2, the real and imaginary coefficients are chosen to be equal to the complex coefficients $\text{Re}U_{i,j,k0}$ and $\text{Im}U_{i,j,k0}$ contained in the first message M1 received, with the index $k_0$ equal to 2.

In various different examples of embodiments, each second device 62A, ..., 62N includes the calculation member, for example in the form of the calculation software application 123A, ..., 123N. Alternatively, the calculation software application 123A is configured for being stored in a device other than the second device 62A, such as for example in the centralisation device 64. The calculation of the active energies $E_1$, $E_2$, $E_3$ is then performed based on the data and information relating to the voltages and intensities contained in different messages received by the centralisation device 64, sent by the first device 60 and by each second device 62A, ..., 62N, that is to say, the first message M1 and respectively the second messages M2A, ..., M2N.

According to another embodiment, not shown, the first device 60 and the centralisation device 64 are combined together into one common device, which makes it possible to have one single radio transmitter receiver for said common device in place of the two radio transmitter receivers 70, 92 needed for the first device and for the centralisation.

It may thus be appreciated that the computation system 20 according to the invention is more accurate than the computation system as per the state of the art.

The invention claimed is:

1. A computation system for calculating the electrical energy of an alternating current flowing in at least one secondary electrical conductor, the secondary conductor being electrically connected to a primary electrical conductor, the primary conductor and each secondary conductor having substantially the same alternating voltage, the alternating current having at least one phase, the computation system comprising:

a first device comprising a radio transmitter, a measuring circuit configured to measure a voltage of the primary conductor and a frequency of the voltage flowing through the primary conductor, a processor configured to sample a value of the measured voltage, the radio transmitter being configured to transmit following a period of transmission of a first message, a given transmission period corresponding to a multiple of voltage periods, the voltage periods being equal to an inverse of a frequency of the alternating voltage, the processor being further configured to determine a set of at least one variable value representative of the measured voltage, said data set being determined based on the value of the voltage measured during the given transmission period corresponding to the multiple of the voltage periods, the first message including said data set;

at least one second device comprising a current intensity sensor configured to determine an intensity of the current flowing in a corresponding secondary conductor using a toroidal sensor disposed to surround the secondary conductor, a second processor configured to sample a value of the measured intensity; and at least one computing device configured to calculate an electrical energy for each phase of said current flowing in the corresponding secondary conductor, the at least one computing device being connected to at least one corresponding second device and including a radio transmitter/receiver configured to receive the first message, the at least one computing device being configured to calculate a value for the electrical energy during a given transmission period based on said data set contained in the first message and samples of the intensity associated with the given transmission period, wherein the processor of the first device is configured to determine said data set based further on a correction coefficient associated with the given transmission period, the correction coefficient being, for each phase, a function of a value representative of the voltage only for each corresponding voltage period where said representative value is greater than a predetermined threshold value, and the correction coefficient is a function of at least one ratio between two modulus of values corresponding to a fundamental frequency of a Fourier series decomposition of a voltage for two different voltage periods.

2. The system according to claim 1, wherein the correction coefficient satisfies, for each phase, the following equation:

$$\sigma_i = \frac{1}{k_{max}} \times \sum_{\forall k/\|U_{i,1,k}\| \geq \varepsilon} \frac{\|U_{i,1,k}\|}{\|U_{i,1,k_0}\|}$$

where i is an index of the corresponding phase,
k is an index of the voltage period, with k comprised between 1 and K, K being equal to the number of voltage periods occurring during a transmission period,
$k_0$ is an index of a voltage period selected from among the plurality of voltage periods,
$k_{max}$ is a number of voltage periods for which a value of the modulus of a fundamental of a Fourier series decomposition of the voltage is greater than a predetermined threshold value $\varepsilon$ during the given transmission period, and
$\|U_{i,1,k}\|$ and $\|U_{i,1,k_0}\|$, respectively represent the modulus of the fundamental of the Fourier series decomposition of the voltage for the phase having index i and the voltage period having index k, and respectively the selected voltage period having index $k_0$.

3. The system according to claim 1, wherein said set of at least one representative variable value has a plurality of real and imaginary coefficients of a Fourier series decomposition of the measured voltage.

4. The system according to claim 3, wherein the electrical energy satisfies, for each phase, the following equations:

$$E_i = \sum_{j=1}^{J} E_{i,j} \text{ and } E_{i,j} = \sum_{k=1}^{K} P_{i,j,k} \times P_{transmission}$$

where i is an index of the corresponding phase,
j is a row of the Fourier series decomposition, with j between 1 and J, J being equal to a number of rows of said decomposition, the fundamental corresponding to a row that is equal to 1,
k is an index of the corresponding voltage period, with k between 1 and K, K being equal to the number of voltage periods occurring during a transmission period, and
$P_{i,j,k}$ represents an active power for a phase having index i, real and imaginary coefficients of row j and the corresponding voltage period having index k.

5. The system according to claim 1, wherein the processor of the first device is further configured to determine, for each phase, an angular deviation based on a ratio for at least one voltage period, the ratio being equal to an imaginary coefficient of a fundamental of a Fourier series decomposition of the voltage over said voltage period divided by a real coefficient of said fundamental of the voltage, and the at least one computing device is configured to calculate a value for the electrical energy based furthermore on the angular deviation.

6. The system according to claim 5, wherein the angular deviation is determined, for each phase, via the following equations:

$$\alpha_i = \frac{1}{K-1} \sum_{k=1}^{K-1} \alpha_{i,k} \text{ and } \alpha_{i,k} = \varphi_i(k+1) - \varphi_i(k) \forall k \in [1; K-1]$$

$$\text{that is } \alpha_i = \frac{\varphi_i(K) - \varphi_i(1)}{K-1} \text{ with } \varphi_i(k) = \arctan\left(\frac{\text{Im}U_{i,1,k}}{\text{Re}U_{i,1,k}}\right)$$

where i is an index of the corresponding phase,
k is an index of the voltage period, with k comprised between 1 and K, K being equal to the number of voltage periods occurring during a transmission period, and
$U_{i,1,k}$ represents a fundamental of the voltage for a phase having index i and the voltage period having index k.

7. The system according to claim 5, wherein a first real coefficient and a first imaginary coefficient of a Fourier series decomposition of the measured voltage are calculated via the following equations, for each voltage period having an index comprised between 3 and K, the selected voltage period having an index equal to 2:

$$\text{Re}U_{i,j,k} = \cos(j \times \alpha_i) \times \text{Re}U_{i,j,k-1} - \sin(j \times \alpha_i) \times \text{Im}U_{i,j,k-1}$$

$$\text{Im}U_{i,j,k} = \cos(j \times \alpha_i) \times \text{Im}U_{i,j,k-1} + \sin(j \times \alpha_i) \times \text{Re}U_{i,j,k-1}$$

and wherein the first real and the first imaginary coefficients of a Fourier series decomposition of the measured voltage are calculated via the following equations, for the voltage period having index equal to 1:

$$\text{Re}U_{i,j,1} = \cos(-j \times \alpha_i) \times \text{Re}U_{i,j,2} - \sin(-j \times \alpha_i) \times \text{Im}U_{i,j,2}$$

$$\text{Im}U_{i,j,1} = \cos(-j \times \alpha_i) \times \text{Im}U_{i,j,2} + \sin(-j \times \alpha_i) \times \text{Re}I_{i,j,2}.$$

8. An electrical cabinet, comprising:
a panel including at least one primary output electrical conductor and at least one secondary output electrical conductor, each secondary output conductor being electrically connected to a corresponding primary output conductor, the at least one primary and at least one secondary output conductors having an alternating voltage, and
a computation system to calculate an electric energy of a current flowing in each secondary output conductor,
wherein the computation system is in accordance with claim 1.

9. A transformer substation for transformation of an electric current having a first alternating voltage into an electric current having a second alternating voltage, comprising:
an electrical cabinet according to claim 8, including an input panel including at least one input electrical conductor configured to connect to an electrical network, the input electrical conductor having the first alternating voltage, electrical cabinet further including an output panel, wherein corresponding output conductors have the second alternating voltage, and an electrical transformer connected between the input panel and the output panel, the transformer being configured to transform a current having the first alternating voltage into a current having the second alternating voltage.

10. A method for calculating an electric energy of an alternating current flowing in at least one secondary electrical conductor, the secondary conductor being electrically connected to a primary electrical conductor, the primary conductor and each secondary conductor having substantially the same alternating voltage, the alternating current having at least one phase, the method comprising:

measuring, by a first device, of a voltage of the current flowing in the primary conductor and a frequency of the voltage flowing through the primary conductor, sampling of a value of the measured voltage, determining of a set of at least one variable value representative of the measured voltage, said data set being determined based on the value of the voltage measured during a given transmission period corresponding to a multiple of voltage periods, with first message containing said data set, and transmitting following a period of transmission of a first message, the given transmission period corresponding to the multiple of the voltage periods, the voltage periods being equal to an inverse of a frequency of the alternating voltage, measuring, by a second device, of an intensity of the current flowing in the corresponding secondary conductor using a toroidal sensor disposed to surround the secondary conductor, and sampling of a value of the measured intensity, and calculating by at least one computing device, of an electrical energy for each phase of said current flowing in the corresponding secondary conductor, the computing device being connected to at least one corresponding second device and including a radio transmitter/receiver configured to receive the first message, the calculation of the electric energy being performed based on said data set contained in the first message and samples of the intensity associated with the given transmission period, wherein said data set is determined based further on a correction coefficient associated with the given transmission period, the correction coefficient being, for each phase, a function of a value representative of the voltage only for each corresponding voltage period where said representative value is greater than a predetermined threshold value, and the correction coefficient is a function of at least one ratio between two modulus of values corresponding to a fundamental frequency a fundamental of a Fourier series decomposition of a voltage for two different voltage periods.

* * * * *